(12) United States Patent
Liu et al.

(10) Patent No.: US 11,017,958 B2
(45) Date of Patent: May 25, 2021

(54) MONOLITHIC FLEXIBLE SUPERCAPACITORS, METHODS OF MAKING AND USES THEREOF

(71) Applicant: Massachusetts Institute of Technology, Cambridge, MA (US)

(72) Inventors: Andong Liu, Brookline, MA (US); Karen K. Gleason, Cambridge, MA (US); Peter Kovacik, Oxford (GB)

(73) Assignee: Massachusetts Institute of Technology, Cambridge, MA (US)

( * ) Notice: Subject to any disclaimer, the term of this patent is extended or adjusted under 35 U.S.C. 154(b) by 65 days.

(21) Appl. No.: 16/483,679

(22) PCT Filed: Feb. 7, 2018

(86) PCT No.: PCT/US2018/017206
§ 371 (c)(1),
(2) Date: Aug. 5, 2019

(87) PCT Pub. No.: WO2018/148266
PCT Pub. Date: Aug. 16, 2018

(65) Prior Publication Data
US 2020/0020489 A1    Jan. 16, 2020

Related U.S. Application Data

(60) Provisional application No. 62/455,858, filed on Feb. 7, 2017.

(51) Int. Cl.
*H01G 11/86* (2013.01)
*H01L 31/053* (2014.01)
(Continued)

(52) U.S. Cl.
CPC ............. *H01G 11/86* (2013.01); *H01G 11/28* (2013.01); *H01G 11/48* (2013.01); *H01G 11/56* (2013.01); *H01G 11/68* (2013.01); *H01L 31/053* (2014.12)

(58) Field of Classification Search
CPC ........ H01G 11/28; H01G 11/48; H01G 11/56; H01G 11/68
See application file for complete search history.

(56) References Cited

U.S. PATENT DOCUMENTS

| 2012/0043120 A1 | 2/2012 | Gadkaree et al. |
| 2013/0155579 A1 | 6/2013 | Hunter et al. |
(Continued)

FOREIGN PATENT DOCUMENTS

| WO | WO-2016/103282 A1 | 6/2016 |
| WO | WO-2018/148266 A1 | 8/2018 |

OTHER PUBLICATIONS

Pandey et al., All-solid-state supercapacitors with poly(3,4-ethylenedioxythiophene)-coated carbon fiber paper electrodes and ionic liquid gel polymer electrolyte, Journal of Power Sources, 245, pp. 857-865 (Year: 2014).*

(Continued)

*Primary Examiner* — Nathan Milakovich
(74) *Attorney, Agent, or Firm* — Foley Hoag LLP; Dana M. Gordon; Alexander J. Chatterley

(57) ABSTRACT

Disclosed are methods for fabricating supercapacitors (SCs) via vapor printing, specifically oxidative chemical vapor deposition (oCVD). Also disclosed are methods of using the supercapacitors, in particular for energy storage devices and photovoltaics.

15 Claims, 9 Drawing Sheets

(51) Int. Cl.
*H01G 11/28* (2013.01)
*H01G 11/48* (2013.01)
*H01G 11/56* (2013.01)
*H01G 11/68* (2013.01)

(56) References Cited

U.S. PATENT DOCUMENTS

| | | | |
|---|---|---|---|
| 2014/0014403 A1 | 1/2014 | Miller et al. | |
| 2014/0029162 A1* | 1/2014 | Hur | H01G 11/86 361/502 |
| 2014/0376158 A1 | 12/2014 | Kim et al. | |
| 2015/0027529 A1* | 1/2015 | Barr | H01L 51/442 136/256 |
| 2018/0237993 A1* | 8/2018 | Kurungot | D21H 17/46 |
| 2019/0148714 A1* | 5/2019 | Richardson | H01M 4/0483 429/213 |

OTHER PUBLICATIONS

Liu et al., High-Performance Flexible All-Solid-State Supercapacitor from Large Free-Standing Graphene-PEDOT/PSS Films, Scientific Reports, 5:17045, pp. 1-11 (Year: 2015).*
International Search Report and Written Opinion for International Application No. PCT/US2018/017206 dated Apr. 23, 2018.

* cited by examiner

US 11,017,958 B2

MONOLITHIC FLEXIBLE SUPERCAPACITORS, METHODS OF MAKING AND USES THEREOF

RELATED APPLICATION

This application is the U.S. National Stage of PCT/US2018/017206, filed Feb. 7, 2018, which claims the benefit of priority to U.S. Provisional Patent Application Ser. No. 62/455,858, filed Feb. 7, 2017.

GOVERNMENT SUPPORT

This invention was made with government support under Grant No. N00014-13-1-0466, awarded by the Office of Naval Research. The government has certain rights in the invention.

BACKGROUND

Supercapacitors (SCs) are a class of energy storage devices, prized for their high power densities. Flexible solid-state SCs are particularly promising for achieving compact, lightweight, and reliable energy storage. Despite advancements in nanostructured electrode materials and functional electrolytes, flexible SC devices still face challenges arising from the limitations of architectural design. Specifically, current architectures predominantly rely on the layered "sandwich-like" structure, in which different components (e.g., cathode, separator, anode, and optional current collectors) are fabricated separately and then assembled by stacking. This stacking approach can compromise quality of the interfaces between the components and negatively affect the mechanical integrity of the SC. The use of multiple, discrete substrates also adds unnecessary volume and weight to the device, decreasing its volumetric as well as gravimetric capacity. Furthermore, when multiple stacking-based SCs are combined into an array for specific voltage and capacitance rating, wire interconnects are often used, reducing the mechanical integrity even further.

While advanced writing/printing-based fabrication techniques have been applied, microfabrication processes face several challenges, including high cost and high-throughput scalability. Moreover, most of these works employed an "in-plane" configuration, which utilizes only one side of the substrate. Thus, there remains a need in the art to improve writing/printing based techniques to, for example, take advantages of both sides as well as to lower costs and improve high-throughput scalability.

SUMMARY

Methods for fabricating supercapacitors (SCs) via vapor printing, specifically oxidative chemical vapor deposition (oCVD), are disclosed herein. In some embodiments, pseudocapacitive PEDOT was synthesized into both sides of single sheets of porous substrate, with the inner part of the substrate functioning as separator. In some embodiments, the methods disclosed herein utilize in situ ion gel synthesis for the solid-state electrolyte incorporation.

Also provided are applications of the methods disclosed herein. In certain embodiments, the methods disclosed herein were demonstrated using filter paper. In certain embodiments, the methods disclosed herein were demonstrated using porous nylon membrane. The monolithic devices comprise a porous substrate; a current collector disposed on a portion of at least one side of the porous substrate; a pseudo-capacitive material disposed on the surface of the current collector; and an ion gel electrolyte.

Exemplary materials were shown to have excellent specific volumetric capacitance, power density, and energy density, due to the large loading of active materials, minimization of inactive materials, and good electrode-electrolyte interfaces formed. Accordingly, SCs in various circuit configurations could be easily printed on a single substrate.

DETAILED DESCRIPTION

An aspect of the present invention relates to methods for fabricating supercapacitors (SCs) via vapor printing, specifically oxidative chemical vapor deposition (oCVD). Compared to stacking multiple layers into a SC, the methods disclosed herein enable monolithic integration of all components into a single-sheet substrate, minimizing the inactive materials and eliminating the possibility of multilayer delamination.

In some embodiments, electrodes comprised of pseudocapacitive material, such as poly(3,4-ethylenedioxythiophene) (PEDOT), are deposited into both sides of a sheet of flexible porous substrate. The film deposition and patterning are achieved in a single step. In some such embodiments, the oCVD PEDOT penetrates partially into the porous substrate from both surfaces, while leaving the interior of the substrate serving as a separator. More specifically, near the surface, the PEDOT coating conforms to the substrate's structure without blocking the pores, resembling the substrate's intrinsic morphology with high surface area. Without being bound by any one particular theory, the porously structured PEDOT coating, paired with in situ ion gel electrolyte synthesis, gives enhanced electrode-electrolyte interfaces.

In some embodiments, the monolithic devices disclosed herein demonstrate high volumetric capacitance (11.3 F cm$^{-3}$), energy density (2.98 mWh cm$^{-3}$), and power density (0.42 W cm$^{-3}$). In certain embodiments, the volumetric capacitance of the flexible monolithic semiconductor is from about 8 F cm$^{-3}$ to about 20 F cm$^{-3}$ or higher, for example, from about 10 F cm$^{-3}$ to about 15 F cm$^3$. In certain embodiments, the energy density of the flexible monolithic semiconductors is from about 1 mWh cm$^{-3}$ to about 8 mWh cm$^{-3}$, or higher, for example, from about 2 mWh cm$^{-3}$ to about 6 mWh cm$^{-3}$. In certain embodiments, the power density of the flexible monolithic semiconductors is from about 0.3 W cm$^{-3}$ to about 0.7 W cm$^{-3}$, or higher, for example, from about 0.3 W cm$^{-3}$ to about 0.5 W cm$^{-3}$. These performance metrics are attributed in part to the large loading of active materials, minimization of inactive materials, and good electrode-electrolyte interfaces. Thus, SC arrays may be printed on a single substrate without the use of wire interconnects.

Figure 5:
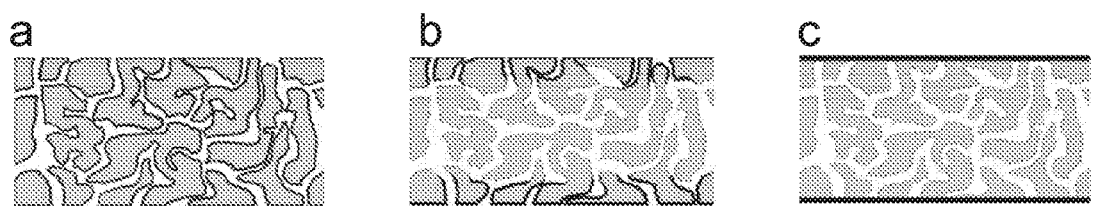
FIGS. 5A-C show schematics of porous substrates coated by PEDOT with full conformality (FIG. 5A), partial conformality (FIG. 5B), and non-comformality (FIG. 5C).

In some embodiments, with the vapor-phase deposition process for the electrodes, the conformality of the coating coverage can be controlled, and therefore so can the degree to which the coating penetrates into porous substrates. Baxamusa et al. *Chem. Trap. Deposition* 2008, 14, 313. The partially conformal coverage achieved using our approach (Coclite et al. *Adv. Mater.* 2013, 25, 5392), as schematically shown in FIG. 5 was desirable for constructing SC devices.

In some embodiments, the conformal nature of the coating may allow for the utilization of the large surface area of porous substrate and contributes to the large loading of active materials. In some such embodiment, the finite vapor penetration depth into the porous substrate ensures separation of the electrodes deposited from opposite sides of a substrate, thus prevents electrical shorting. Indeed, this is the first disclosure of the combination of these previously mutually exclusive characteristics. In contrast, commonly used solution-based coatings of paper and textile substrates suffer from poor control of the coating depth caused by wetting effects. (Hu et al., *Appl. Phys. Lett.* 2010, 96, 2008.)

In some embodiments, excessive oxidant was eliminated. In some embodiments, during the oCVD process, the polymerized thin films were formed via simultaneous exposure to vapor-phase monomer (EDOT) and oxidant (FeCl$_3$) at low substrate temperatures (≈50° C.) and moderate vacuum (see Im et al., *Macromolecules* 2007, 40, 6552).

Figure 1:
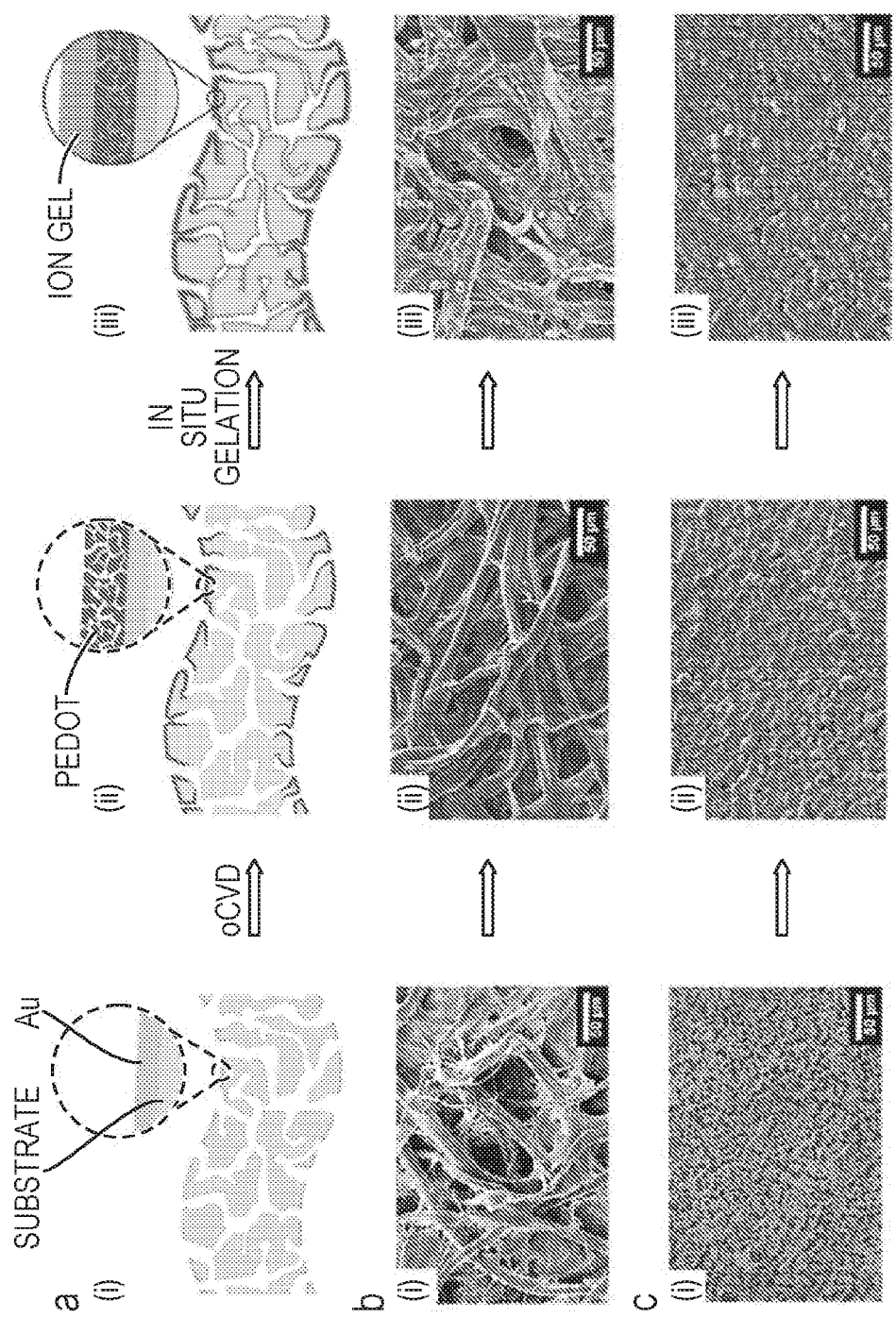
FIGS. 1A(i)-(iii) are schematic illustrations of the intermediate/final configurations of vapor printed solid state SC (i-iii) after being treated by steps (i-iii), respectively. The drawings indicate the substrate, gold current collector, pseudocapacitive material (PEDOT), and the ion gel electrolyte.
FIGS. 1B(i)-(iii)-C(i)-(iii) are SEM images of the FP substrate (FIG. 1B(i)-(iii)) and the NM substrate (FIG. C) after steps (i-iii), respectively.

In other embodiments, the configuration after treatment step (ii) is shown in FIG. 1A(ii); (iii) Homogeneous mixture of ionic liquid 1-ethyl-3-methyl-imidazolium tetrafluoroborate ([EMIM][BF$_4$]), monomer N,N-dimethylacrylamide (DMAA), cross-linker ethylene glycol dimethacrylate (EGDMA), and thermal initiator 1.0 wt % of 4,4'-azobis(4-cyanovaleric acid) (ABCVA) ([EMIM][BF$_4$]/DMAA/EGDMA=150/50/1, v/v/v) was drop-cast on the electrode. The mixture of precursors spontaneously wetted through the electrodes and substrate. Ion gel electrolyte was then in situ synthesized inside the PEDOT electrodes and substrate via thermally initiated polymerization of the vinyl monomers at 90° C. FIG. 1A(iii) shows the final device configuration.

In certain embodiments, the surface morphology of the substrates was examined after each treatment step. FIG. 1B(i-iii) shows the surfaces of the FP and FIG. 1C(i-iii) the surfaces of the NM after the fabrication steps (i-iii). Both substrates before electrode printing (FIG. 1B(i),C(i)) feature porous surfaces with large surface area suitable for high energy and high power SC per-formance. The surface of the FP (FIG. 1B(i)) is composed of coarse cellulose fibers (≈20 μm diameter). In contrast, the NM (FIG. 1C(i)) displays exceptionally fine and uniform porous structure (≈5 μm features). Accordingly, the BET surface area of the bare NM (3.22 m$^2$·g$^{-1}$) is substantially higher than that of the bare FP (1.28 m$^2$·g$^{-1}$). This fine and uniform structure of larger surface area underpins the superior device performance.

The morphological changes of the surfaces after PEDOT electrode printing are shown in FIG. 1B(ii),C(ii). Specifically, in FIG. 1B(ii), the smaller pores and fibers of the FP are less prominent after PEDOT deposition. This may be indicative of the presence of the PEDOT coating, which is thick enough to fill the smaller pores. To compare, in FIG. 1C(ii), the PEDOT coating appears more uniform due to the underlying uniform porous structure of the NM substrate on which the PEDOT was coated. For both substrates, the PEDOT deposited via oCVD evenly coats the substrate surface and conforms to the outer texture of substrate. (Coclite et al., *Adv. Mater.* 2013, 25, 5392.) The conformal nature of the PEDOT coating allows the high loading of active materials into some depth of the substrates' 3D network; at the same time, it may ensure that the pores are not fully blocked off by the PEDOT layer. Without being bound by any one particular theory, these open pores allow the penetration of gel electrolyte precursors in step iii, and the formation of good interfaces between electrode and gel electrolyte.

A major challenge associated with the direct integration of electrodes into the opposite sides of a thin porous substrate is the potentiality of an electrical short across the substrate. Therefore, control of the degree of coating conformality is key to the successful integration of electrodes in our SC device fabrication. Three representative scenarios of conformality are shown schematically in FIG. 5. In the case of full conformality, PEDOT coating thickness would be uniform across the thickness of porous substrate (FIG. 5A). In the case of nonconformal coverage, coatings appear to form two slab layers on top of either side of substrate (FIG. 5C).

In some embodiments, coating with full conformality gives large surface area, but connects the two electrodes and results in an electrical short. In other embodiments, nonconformality ensures the segregation of electrodes, but minimizes the surface area of coating, which would jeopardize the high power character of the SC device.

In preferred embodiments, the two electrodes were monolithically integrated into opposite sides of a substrate. In some such embodiments, the partially conformal coverage (FIG. 5B), allows the utilization of porous structure for high surface area coating and high materials loading, but simultaneously ensuring effective segregation of electrodes. Facile conformality control is a key advantage of polymer CVD techniques over other deposition techniques. (Baxamusa et al., *Chem. Vap. Depos.* 2008, 14, 313; Coclite et al., *Adv. Mater.* 2013, 25, 5392).

In some embodiments, adjustment of oCVD parameters allows formation of coatings with partial conformality and ensures that the degree of coating penetration is limited to less than half the thickness of the substrates. In some such embodiments, this is done by maintaining the partial pressure of vapor-delivered oxidant sufficiently close to its saturation pressure.

Because oCVD is a dry process, there are no wettability effects that could cause undesirable penetration of the reactants throughout the thickness of the porous substrate. In comparison, a solution-based coating process often has less control of coating conformality, allowing the free penetration of active materials through wetting.

In some embodiments, techniques, such as pretreatment of the substrates with hydrophobic coating, were employed to suppress the uncontrolled wetting. (Hu et al., *Appl. Phys. Lett.* 2010, 96, 2008.) In some such embodiments, the penetration of the oCVD PEDOT into a FP and NM can be directly observed from the cross-sectional energy-dispersive X-ray spectroscopy (EDS) mapping of the sulfur present only in PEDOT (FIG. 2B, D, respectively).

Figure 2:
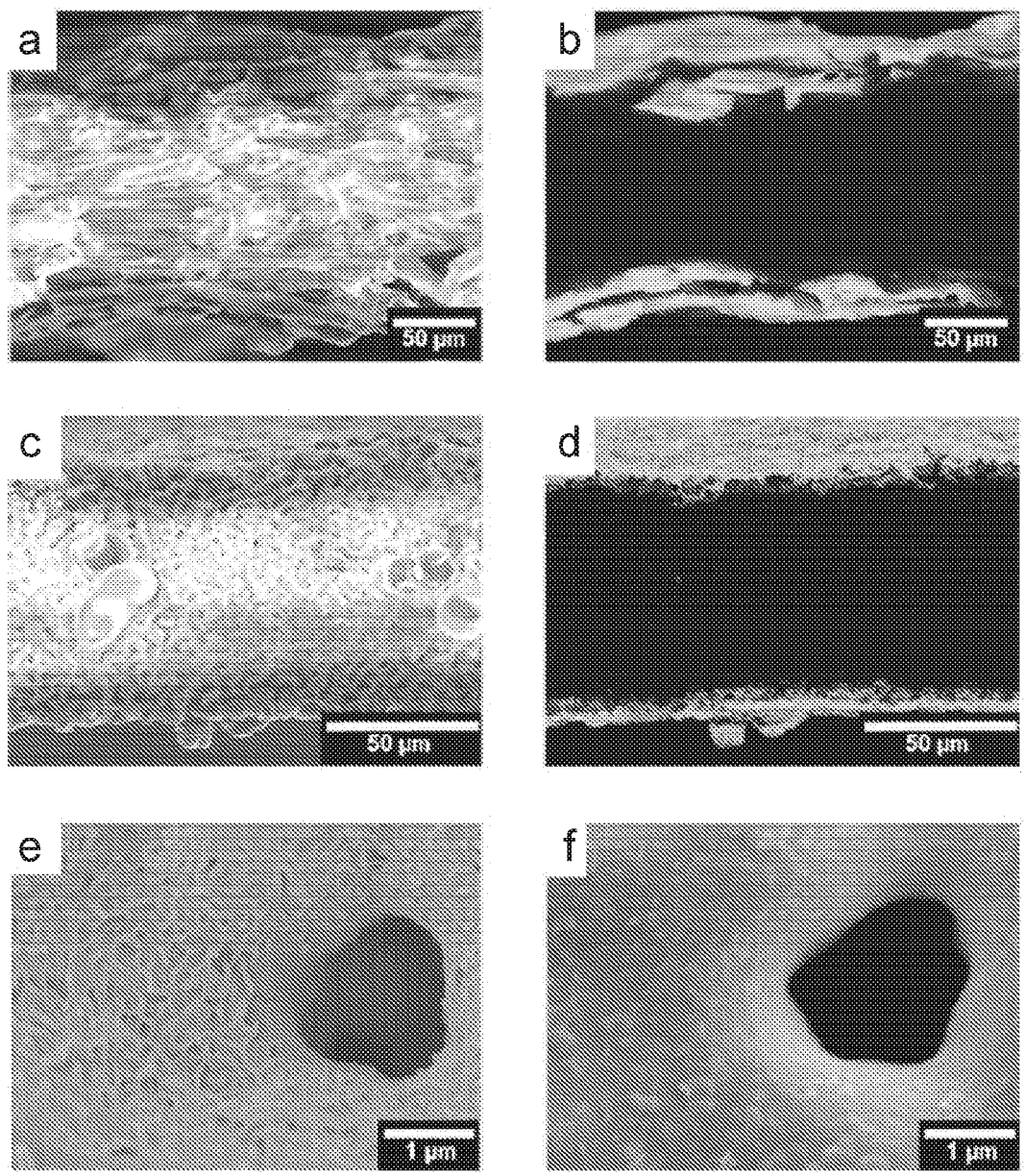
FIG. 2A shows the cross-sectional SEM image for the FP with oCVD electrodes.
FIG. 2B shows the EDS elemental map of sulfur for the FP with oCVD electrodes.
FIG. 2C shows the cross-sectional SEM image for the NM with oCVD electrodes.
FIG. 2D shows the EDS elemental map of sulfur for the NM with oCVD electrodes
FIGS. 2E and 2F show high-resolution SEM images of PEDOT surface before (FIG. 2E) and after (FIG. 2F) in situ ion gel electrolyte synthesis.

Clean cross-sections with minimal distortion, as shown in FIG. 2A, C, were prepared by embedding the sample in ice and freeze-fracturing the entire slab (Cryo-Snap). (Ferlita et al., *Prog.* 2008, 27, 20.) The PEDOT coating appeared to be restricted approximately in the top 30 µm depth of either side for the FP-based device, and 10 µm depth for the NM-based device, leaving gaps of 110 and 60 µm, respectively, in between. The electrochemical performance of the fabricated device shown in the latter section of this article further confirms the effective segregation of the electrodes.

In some embodiments, the microstructure of PEDOT electrodes was optimized by fine-tuning the oCVD deposition conditions. In some such embodiments, a high oxidant-to-monomer ratio was set in order to generate a secondary porous structure. Despite the coating appearing smooth in FIG. 1B(ii),c(ii) at low magnification, the high-resolution scanning electron microscopy (SEM) image of oCVD PEDOT, shown in FIG. 2E, which may indicate the formation of a secondary porous structure inside the PEDOT coating. Consistent with the morphology, the BET surface area of the NM with oCVD PEDOT ($\approx$9.49 $m^2 \cdot g^{-1}$) increased significantly from that of the bare NM substrate ($\approx$3.22 $m^2 \cdot g^{-1}$), confirming the formation of the secondary structure with greater surface area.

In some embodiments, the excess oxidant residues were dissolved and rinsed out by methanol, leaving secondary pores behind. In some such embodiments, the secondary pores provided for expanded pathways for the infusion of the electrolyte into the electrodes and therefore larger electrode-electrolyte interfacial areas.

In certain embodiments, secondary porous structure was formed by fine-tuning the oCVD condition. In some such embodiments, in situ ion gel synthesis was utilized to incorporate a solid-state electrolyte, enabling the formation of excellent electrode-electrolyte interfaces. The methods disclosed herein show that the monolithic device fabricated has outstanding energy and power densities, resulting from the large loading of active materials, the minimization of inactive materials and the exceptional interfaces.

The materials, fabrication procedure and intermediate/final configurations of vapor-printed solid-state SC device of the invention are schematically depicted in FIG. 1A.

In some embodiments, a flexible and/or porous substrate was used. In some such embodiments, the substrate was general purpose cellulose filter paper (FP) or porous nylon membrane (NM). The FP was selected to demonstrate the compatibility of vapor printing with common and inexpensive substrates; the NM was selected due to its high porosity, large specific surface area, uniform morphology and robustness. In certain embodiments, the porous substrate is fibrous. In certain embodiments, the porous substrate is organic or inorganic. For example, the average pore diameter of the pores in the porous substrate may be from about 1 nm to about 100 µm, or from about 1 µm to about 30 µm. In certain embodiments, the average pore diameter is about 1 nm, about 2 nm, about 3 nm, about 5 nm, about 5 nm, about 10 nm, about 50 nm, about 100 nm, about 500 nm, about 1 , about 2 µm, about 3 µm, about 4 µm, about 5 µm, about 10 µm, about 50 µm, or about 100 µm, for example, about 5 µm. Average pore size may be estimated or calculated using methods known in the art, such as SEM. In certain embodiments, the porous substrate is from about 0.05 mm to about 1 mm in thickness, for example, from about 0.05 mm to about 0.5 mm.

In some embodiments, the methods disclosed herein comprise three steps (i-iii): (i) current collectors ($\approx$100 nm) comprising gold, silver, or platinum were sputtered onto both sides of an exposed or un-masked portion of the porous substrate to enhance electron transport to/from the pseudocapacitive electrodes. In some such embodiments, the substrate was initially pretreated by silanization with (3-mercaptopropyl)trimethoxysilane in order to promote its adhesion to gold. The intermediate configuration of the SC after this step is shown in FIG. 1A(i).

(ii) Electrodes of pseudocapacitive material, such as poly (3,4-ethylenedioxythiophene) (PEDOT) or polypyrrole (Arcy et al., *ACS Nano* 2014, 8, 1500; Ghaffari et al., *Electrochim. Acta* 2013, 112, 522; Yu et al., *Nano Energy* 2013, 2, 213; Snook et al., *J. Power Sources* 2011, 196, 1; Festin et al., *Sensors Actuators, B Chem.* 2014, 193, 82), were deposited onto the current collectors via oCVD followed by methanol rinsing to eliminate excessive oxidant. In some embodiments, during the oCVD process, the polymerized thin films were formed via simultaneous exposure to vapor-phase monomer (EDOT) and oxidant (FeCl$_3$) at low substrate temperatures ($\approx$50° C.) and moderate vacuum (Im et al., *Macromolecules* 2007, 40, 6552). The configuration after treatment step (ii) is shown in FIG. 1a(ii).

(iii) Homogeneous mixture of an ionic liquid, such as 1-ethyl-3-methylimi-dazolium tetrafluoroborate ([EMIM][BF$_4$]), monomer N,N-dimethylacrylamide (DMAA), crosslinker ethylene glycol dimethacrylate (EGDMA), and thermal initiator 1.0 wt % of 4,4'-azobis(4-cyanovaleric acid) (ABCVA) ([EMIM][BF$_4$]/DMAA/EGDMA=150/50/1, v/v/v) was drop-cast on the electrode, masked or un-masked, preferably unmasked. In other embodiments, the mixture of precursors spontaneously wetted through the electrodes and substrate. Ion gel electrolyte was then in situ synthesized inside the PEDOT electrodes and substrate via thermally initiated polymerization of the vinyl monomers at 90° C. FIG. 1a(iii) shows the final device configuration.

The surface morphology of the substrates was examined after each treatment step. FIG. 1C(i-iii) shows the surfaces of the FP and FIG. 1C(i-iii) the surfaces of the NM after the fabrication steps (i-iii). Both substrates before electrode printing (FIG. 1B(i),C(i)) feature porous surfaces with large surface area suitable for high energy and high power SC performance. The surface of the FP (FIG. 1b(i)) is composed of coarse cellulose fibers ($\approx$20 urn diameter). In contrast, the NM (FIG. 1c(i)) displays exceptionally fine and uniform porous structure ($\approx$5 μm features). Accordingly, the BET surface area of the bare NM (3.22 m$^2 \cdot$g$^{-1}$) is substantially higher than that of the bare FP (1.28 m$^2 \cdot$g$^{-1}$). This fine and uniform structure of larger surface area underpins the superior device performance.

The morphological changes of the surfaces after PEDOT electrode printing are shown in FIG. 1C(ii), C(ii). Specifically, in FIG. 1C(ii), the smaller pores and fibers of the FP were less prominent after PEDOT deposition. This indicates the presence of the PEDOT coating, which was thick enough to fill the smaller pores. To compare, in FIG. 1C(ii), the PEDOT coating appears more uniform due to the underlying uniform porous structure of the NM substrate on which the PEDOT was coated. For both substrates, the PEDOT deposited via oCVD evenly coated the substrate surface and conformed to the outer texture of substrate. (Coclite et al., *Adv. Mater.* 2013, 25, 5392.) The conformal nature of the PEDOT coating allows the high loading of active materials into some depth of the substrates' 3D network; at the same time, it ensures that the pores are not fully blocked off by the PEDOT layer. These open pores allow the penetration of gel electrolyte precursors in step iii, and the formation of good interfaces between electrode and gel electrolyte. A major challenge associated with the direct integration of electrodes into the opposite sides of a thin porous substrate is the potentiality of an electrical short across the substrate. Therefore, control of the degree of coating conformality is key to the successful integration of electrodes in our SC device fabrication. To illustrate the importance of conformality control, three representative scenarios of conformality are schematically illustrated in FIG. 5. In the case of full conformality, PEDOT coating thickness would be uniform across the thickness of porous substrate (FIG. 5A). In certain embodiments, the thickness of the pseudo-capacitive material is less than half of the average pore diameter of the porous substrate.

In some embodiments, with nonconformal coverage, coatings form two slab layers on top of either side of substrate (FIG. 5C). In other embodiments, coating with full conformality gives large surface area, but connects the two electrodes and results in an electrical short. In still other embodiments, nonconformality ensures the segregation of electrodes, but minimizes the surface area of coating, which would jeopardize the high power character of the SC device.

Figure 9:
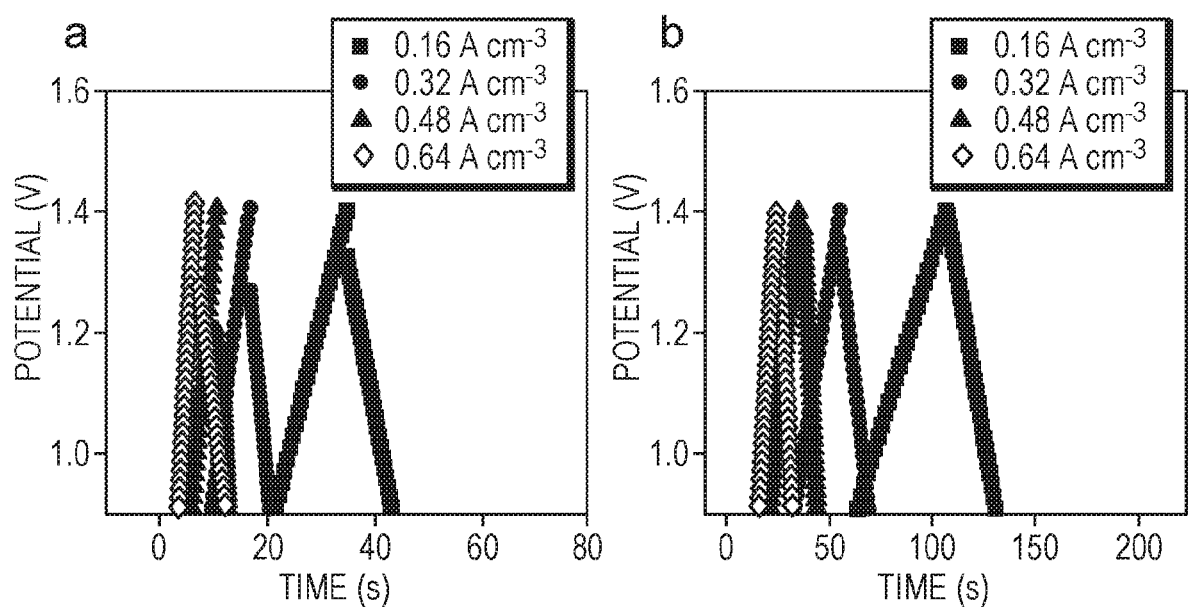
FIG. 9A and B show an enlarged view of IR drops for the FP-based (FIG. 9A) and NM-based (FIG. 9B) SCs at various current densities.

In some embodiments, two electrodes were monolithically integrated into opposite sides of a substrate, the partially conformal coverage (FIG. 9B). In some such embodiments, this partial conformal coverage allows the utilization of porous structure for high surface area coating and high materials loading, but simultaneously ensuring effective segregation of electrodes. Facile conformality control is a key advantage of polymer CVD techniques over other deposition techniques. (Baxamusa et al., *Chem. Trap. Depos.* 2008, 14, 31; Coclite et al., *Adv. Mater.* 2013, 25, 5392.)

In certain embodiments, adjustment of oCVD parameters allows formation of coatings with partial conformality and ensures that the degree of coating penetration is limited to less than half the thickness of the substrates. This is done by maintaining the partial pressure of vapor-delivered oxidant sufficiently close to its saturation pressure. Since oCVD is a dry process, there are no wettability effects that could cause the undesirable penetration of the reactants throughout the thickness of the porous substrate. In comparison, a solution-based coating process often has less control of coating conformality, allowing the free penetration of active materials through wetting. Techniques, such as pretreatment of the substrates with hydrophobic coating, need to be employed to suppress the uncontrolled wetting. (Hu et al., *Appl. Phys. Lett.* 2010, 96, 2008.) The penetration of the oCVD PEDOT into a FP and NM can be directly observed from the cross-sectional energy-dispersive X-ray spectroscopy (EDS) mapping of the sulfur present only in PEDOT (FIG. 2B, D, respectively). The clean cross-sections with minimal distortion, as shown in FIG. 2A, C, were prepared by embedding the sample in ice and freeze-fracturing the entire slab (Cryo-Snap). (Ferlita et al., *Environ. Prog.* 2008, 27, 204.) The PEDOT coating is restricted approximately in the top 30 μm depth of either side for the FP-based device, and 10 μm depth for the NM-based device, leaving gaps of 110 and 60 μm, respectively, in between. The electrochemical performance of the fabricated device shown in the latter section of this article further confirms the effective segregation of the electrodes.

In some embodiments, the microstructure of PEDOT electrodes may be fine-tuned to the oCVD deposition conditions. In some such embodiments, a high oxidant-to-monomer ratio was set in order to generate a secondary porous structure. Despite the coating appearing smooth in FIG. 1B(ii), C(ii) at low magnification, the high-resolution scanning electron microscopy (SEM) image of oCVD PEDOT, shown in FIG. 2E, indicates the formation of a secondary porous structure inside the PEDOT coating. Consistent with the morphology, the BET surface area of the NM with oCVD PEDOT ($\approx$9.49 m$^2 \cdot$g$^{-1}$) increased significantly from that of the bare NM substrate ($\approx$3.22 m$^2 \cdot$g$^{-1}$), confirming the formation of the secondary structure with greater surface area. Hypothetically, the unreacted oxidant present inside the structure functioned as a porogen. In some embodiments, the excess oxidant residues were dissolved and rinsed out by methanol, leaving secondary pores behind. The secondary pores provided for expanded pathways for the infusion of the electrolyte into the electrodes and therefore larger electrode-electrolyte interfacial areas.

The methods disclosed herein incorporate the SC electrolyte so as to tailor and to take full advantage of the hierarchically porous electrode. It has been reported previously that extended solid electrode-electrolyte interfaces can be formed by soaking porous electrode with inviscid monomer-electrolyte mixture and subsequently initiating in situ polymer electrolyte gelation. (Anothumakkool et al., *ACS Appl. Mater. Interfaces* 2016, 8, 1233.) In some embodiments, the precursors of the gel:ionic liquid [EMIM][$BF_4$], monomer DMAA, cross-linker EGDMA, and thermal initiator ABCVA. [EMIM][$BF_4$] was chosen because of its ability to dope/dedope PEDOT and its wide electrochemical window. (Ghaffari et al., *Electrochim. Acta* 2013, 112, 522.) DMAA is a highly polar monomer, promising to form gel with [EMIM][$BF_4$]. In some embodiments, a trace cross-linker EGDMA was added to enhance the gel's robustness. ABCVA is a low temperature initiator showing good miscibility with other precursors.

Figure 6:
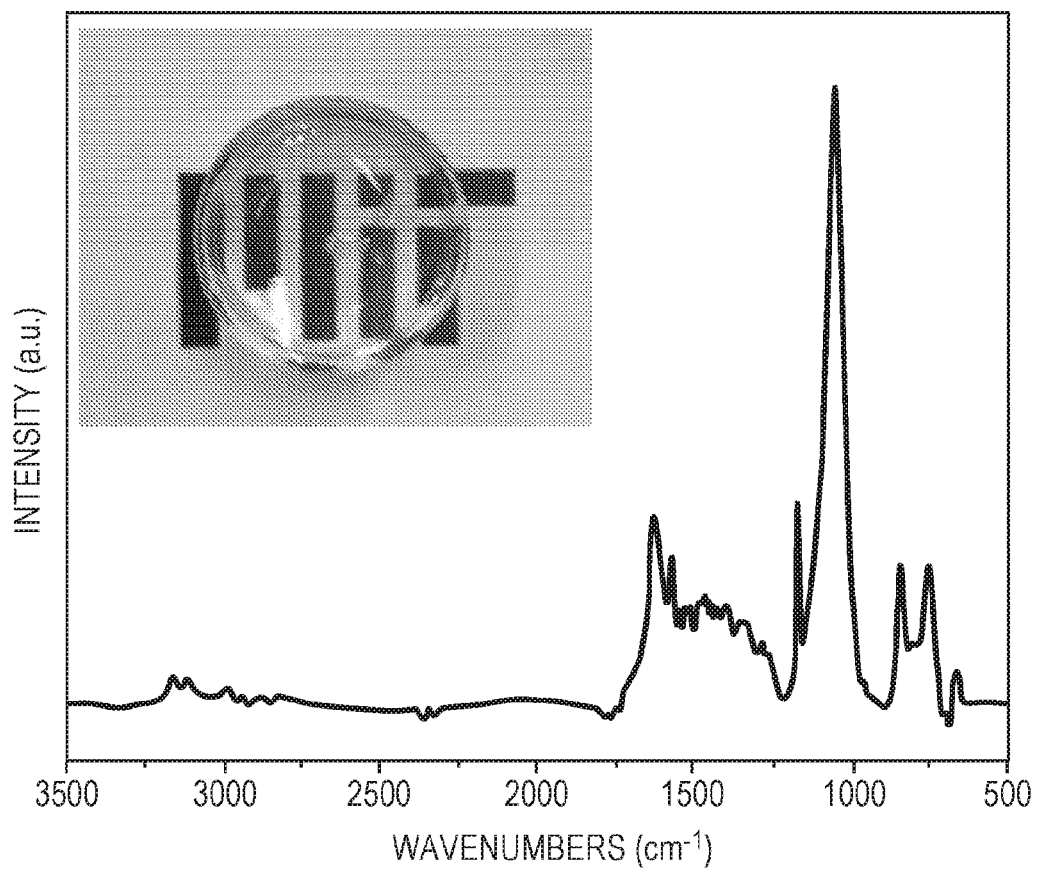
FIG. 6 shows the FTIR spectrum of ion gel electrolyte. The inset is an image of a freestanding ion gel pellet. The sharp band at 1630 cm$^{-1}$ is caused by the carbonyl stretch of pDMAA. See Ferlita et al. *Environ. Prog.* 2008, 27, 204. For [EMIM] [BF$_4$], stretching bands of the imidazolium ring are found at 1574 cm$^{-1}$ and 1171 cm$^{-1}$. See Macmillan et al. *J. Phys. Chem. C* 2014, 118, 29,458. The broad peak centered at 1055 cm$^{-1}$ and the sharp peaks around 1286 cm$^{-1}$ and 756 cm$^{-1}$ were attributed to the stretching modes of the tetrafluoroborate anion.

In some embodiments, a nondestructive thermal condition was achieved through homogeneous initiation. In some such embodiments, the precursor mixture formed was substantially less viscid than pure [EMIM] [$BF_4$]. In other embodiments, the precursor mixture was readily infiltrated the hierarchically porous PEDOT electrodes and the substrate when drop-cast. In some embodiments, upon thermal initiation, the solid-state gel electrolyte coating was in situ synthesized uniformly across the electrodes and substrate. The IR spectrum of a separately prepared freestanding gel pellet (FIG. 6) presents characteristic bands of both DMAA and [EMIM][$BF_4$],(Tenhaeff et al., *Chem. Mater.* 2009, 21, 4323; Macmillan et al., *J. Phys. Chem. C* 2014, 118, 29458).

Figure 7:
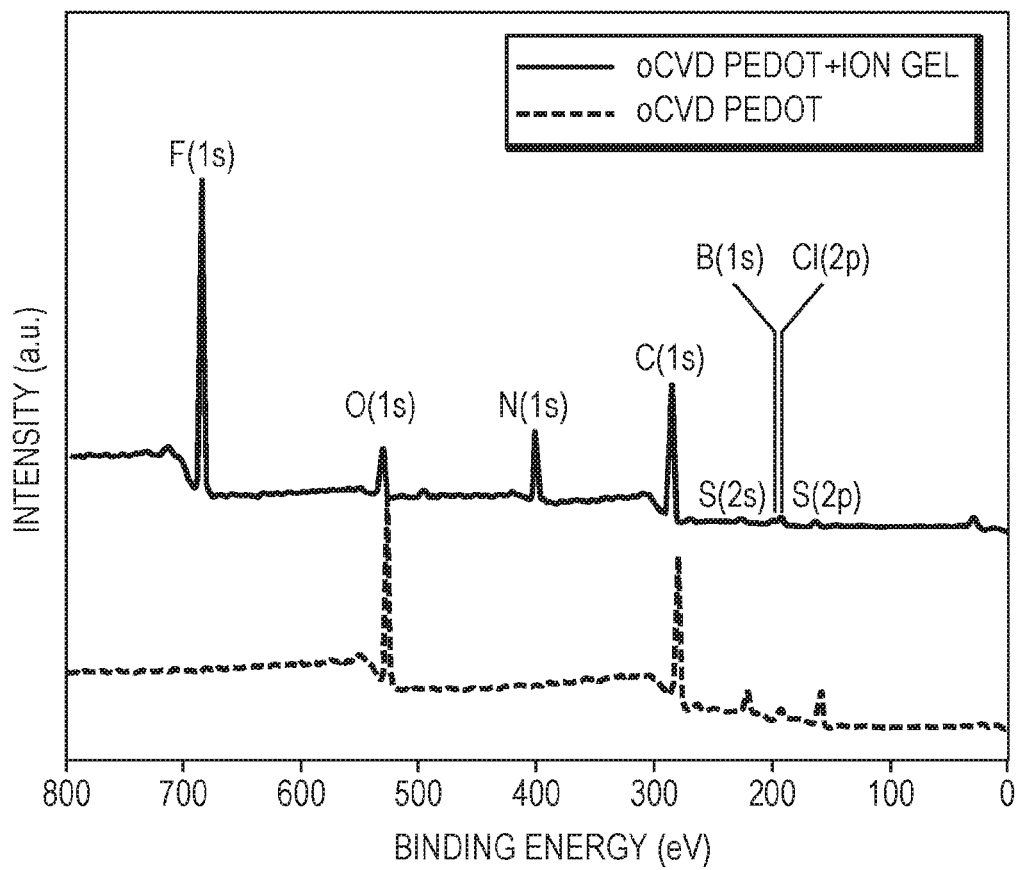
FIG. 7 shows XPS spectra of oCVD PEDOT surface before (lower curve) and after (upper curve) in situ ion gel electrolyte generation
Figure 8:
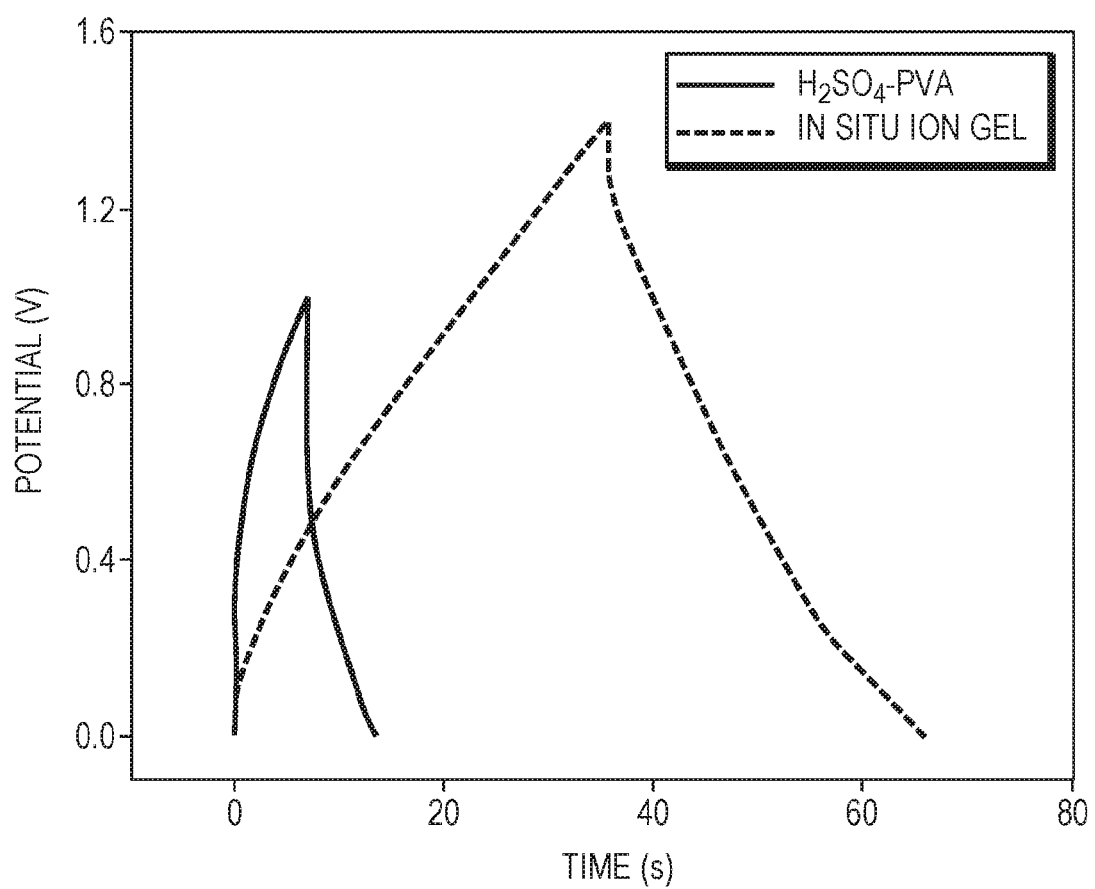
FIG. 8 shows the GV curves of a NM-based SC with conventional H$_2$SO$_4$-PVA gel electrolyte and in situ synthesized ion gel electrolyte at 0.48 A cm$^{-3}$.

The transparent presentation of the ion gel (FIG. 6 inset) illustrates the gel's homogeneity and the absence of microphase separation. The SEM image of PEDOT surface after ion gel incorporation is shown in FIG. 2F. Compared to the as-deposited PEDOT in FIG. 2E, the solid-state electrolyte infiltrated the secondary pores of the PEDOT (but not the primary pores of the substrates), and partially smoothened the electrode surface. The X-ray photoelectron spectroscopy (XPS) results (FIG. 7) show that the electrode after ion gel incorporation presents a substantially reduced sulfur peak ($\approx$164 eV) belonging to PEDOT, indicating an even electrolyte coating on the surface of the PEDOT.

Figure 3:
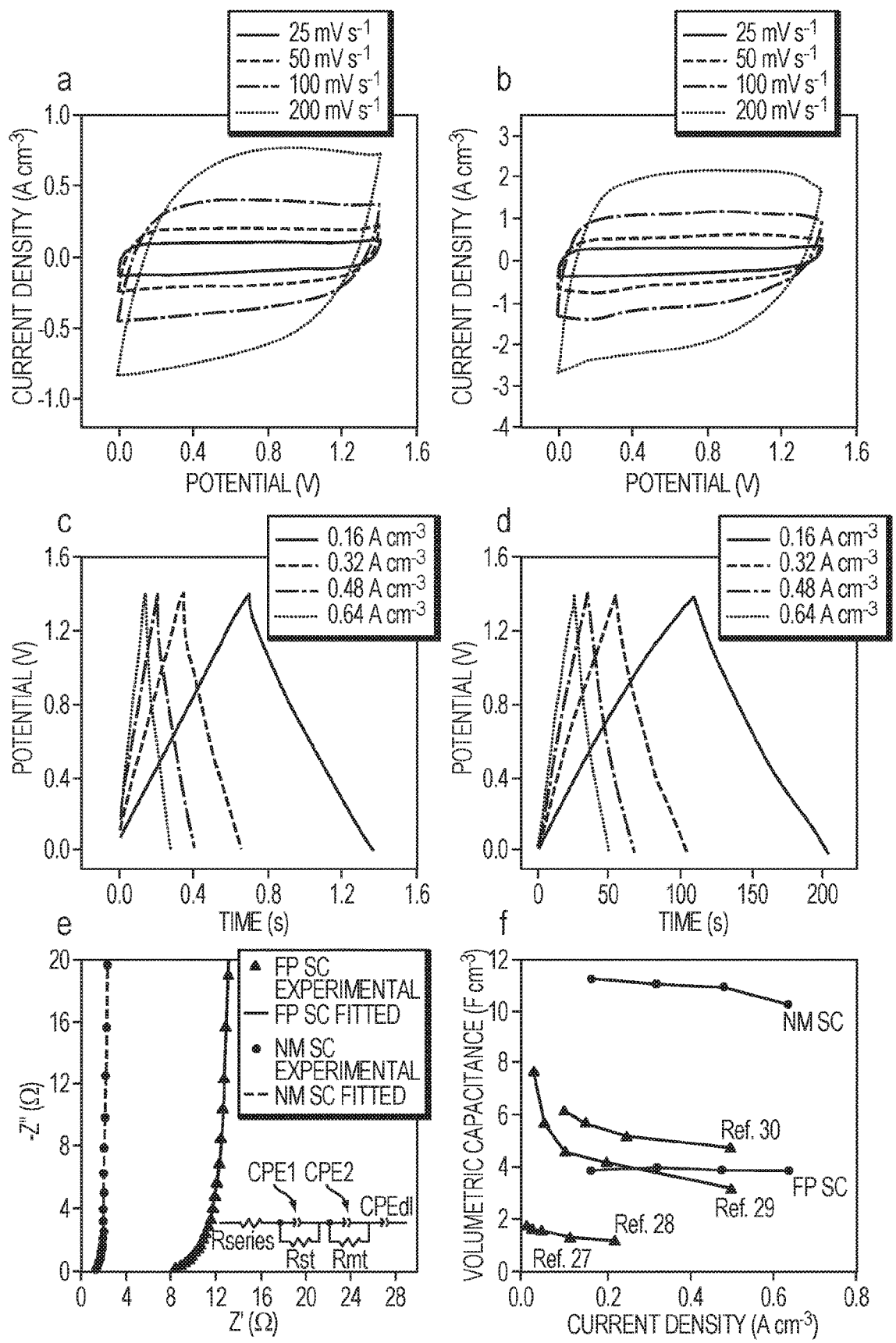
FIG. 3A shows the FP-based SC at various scan rates.
FIG. 3B shows the NM-based SC at various scan rates.
FIG. 3C shows the FP-based SC at various current densities.
FIG. 3D shows the NM-based SC at various current densities.
FIG. 3E shows Nyquist plots of the 1.25×1.25 $cm^2$ FP- and NM-based SCs, and the fitted plots using the equivalent circuit shown in the inset.
FIG. 3F shows the volumetric capacitance of the FP and NM-based SCs compared to state-of-the-art performance.

The electrochemical performance of the vapor-printed SCs was assessed with cyclic voltammetry (CV), galvanostatic (GV) cycling, and electrochemical impedance spectroscopy (EIS) analyses. The results are normalized to the total volume of the entire monolithically integrated device, which is arguably the more realistic measure of the device performance. (Lu et al., *Energy Environ. Sci.* 2014, 7, 216.) FIG. 3A, B shows the CVs for the FP- and NM-based SCs at scan rates ranging from 25 to 200 mV s' within a potential range from 0 to 1.4 V versus the open circuit voltage. The CVs of FP and NM-based SCs are nearly symmetric rectangles, except for some rounding at higher scan rates. The GV curves of the SCs over the voltage window of 0 to 1.4 V are presented in FIG. 3C, D. Both devices exhibited typical triangle-shape profiles and small IR drops (0.07-0.27 V for the FP-based device and 0.02-0.1 V for the NM-based device, see FIG. 9 for enlarged view of IR drops) with cycling current densities from 0.16 to 0.64 A $cm^{-3}$.

Electrochemical impedance spectra obtained for both devices using a 10 mV applied AC voltage from 50 kHz to 10 mHz are fitted to the equivalent circuit in FIG. 3E (inset). They are shown to be in good agreement with the fitting (FIG. 3E). The low frequency tails imply the capacitive behaviors and confirm the absence of electrical short. From the circuit fitting, the equivalent series resistances (ESRs) of the FP- and NM-based SCs are calculated to be 8.4 and 1.3 $\Omega$, respectively. The charge-transfer resistances from impedance fitting are calculated to be 0.59 and 0.38 $\Omega$ in the FP- and NM-based SCs, respectively, demonstrating the high quality of interfaces created through oCVD and the in situ gel electrolyte synthesis.

Comparing these results for the two SCs, the NM-based device demonstrates less rounding of the CVs, smaller IR drops, lower ESR, and lower charge-transfer resistance. The better performance is solely due to the difference in morphology of the substrate materials. The NM has a finer and more uniform structure ($\approx$5 µm diameter features), and greater surface area (3.22 $m^2 \cdot g^{-1}$) than the FP ($\approx$20 µm diameter fibers, 1.28 $m^2 \cdot g^{-1}$), resulting in an increased PEDOT loading and improved ion-transport kinetics in the final device. These findings underscore the impact of substrate morphology on SC device performance, despite the same electrode and electrolyte materials.

Specific capacitances based on the volume of the entire integrated devices (thickness of 170 and 80 µm for the FP-based and the NM-based devices, respectively) were calculated from the GV curves and are compared with state-of-the-art performance for solid-state flexible SCs in FIG. 3f. (Lv et al., *Nano Lett.* 2016, 16, 40; Xie et al., *ACS Nano* 2015, 9, 5636; Xiao et al., *Adv. Mater.* 2013, 25, 5091; Sun et al., *Angew. Chem. Int. ed.* 2015, 54, 4651.)

Figure 10:
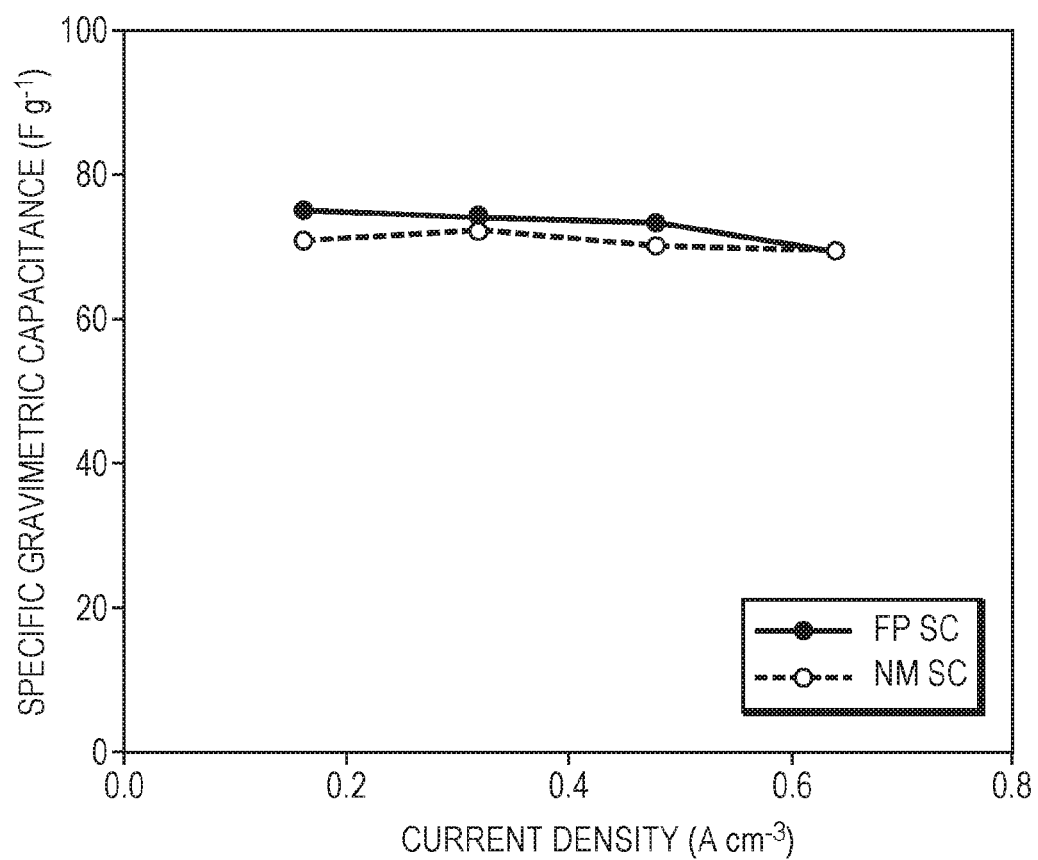
FIG. 10 shows the specific gravimetric capacitance of PEDOT in the FP-based and NM-based SCs at various current densities. By measuring the mass change of the substrates before and after PEDOT deposition, the total mass of PEDOT electrodes are determined to be 2.9 mg for the FP-based SC and 3.1 mg for the NM-based SC.

In some embodiments, the FP-based SC reaches specific capacitance of 3.92 F $cm^{-3}$ at the current density of 0.16 A $cm^{-3}$; the NM-based SC is superior, reaching 11.3 F $cm^{-3}$ at the current density of 0.16 A $cm^{-3}$, and thereby demonstrating some of the highest reported volumetric capacitances. When the current density was increased from 0.16 to 0.64 A $cm^{-3}$, $\approx$90% of the capacitance was retained for both SCs. The good rate capability can be attributed to the excellent electrode-electrolyte interfaces. In addition, the specific gravimetric capacitance based on mass of PEDOT materials was calculated to range from 70 to 75 F $g^{-1}$ (FIG. 10).

Figure 4:
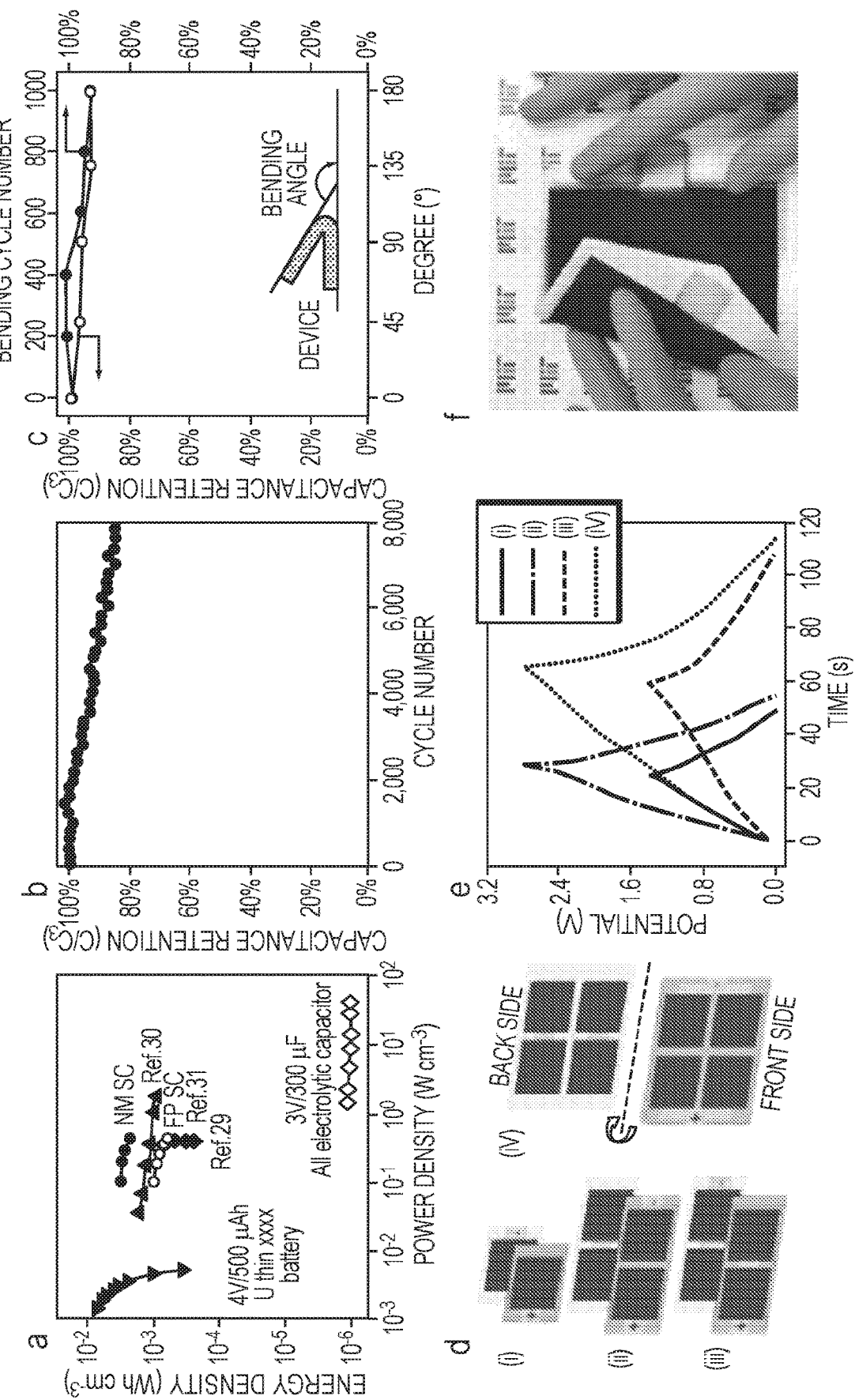
FIG. 4A shows the ragone plot of FP and NM-based SCs. Data for lithium thin film battery and electrolyte capacitor are reproduced from Yu et al. *Nat. Nanotechnol.* 2014, 9, 555.
FIG. 4B shows the capacitance retention of a typical vapor-printed SC using GV.
FIG. 4C shows capacitance retention of a vapor-printed SC at various bending angle (bending radius=3 mm) (light gray color); capacitance retention of a vapor-printed SC as a function of bending cycle number (bending radius=3 mm, angle=90°) is shown by the dark gray color.
FIGS. 4D(i)-(iv) show front-side and back-side pattern for monolithic devices for single cell (FIG. 4(*i*)), 2 cells connected in series (2S, FIG. 4(*ii*)), 2 cells connected in parallel (2P, FIG. 4(*iii*)), and series/parallel connection of four cells (2S2P, FIG. 4(*iv*)).
FIG. 4E shows the GV curves of NM-based single cell (i), 2S (ii), 2P (iii), and 2S2P (iv) at 0.64 A $cm^{-1}$.
FIG. 4F shows an image of a large-area FP-based SC (12×12 $cm^2$).

The energy and power densities of the FP- and NM-based SCs are presented in the Ragone plot (FIG. 4A). The vapor-printed SCs disclosed herein maintained the high power characteristic of SCs and achieved a volumetric energy density of $\approx$2.98 mWh $cm^{-3}$, which is comparable to the recently reported values for supercapacitors and thin-film batteries (0.3-10 mWh $cm^{-3}$). (Yu et al., *Nat. Nanotechnol.* 2014, 9, 55; Xiao et al., *Adv. Mater.* 2013, 25, 5091; Sun et al., *Angew. Chem. Int. ed.* 2015, 54, 4651; Yuan et al. *Energy Environ. Sci.* 2013, 6, 470.)

The FP-based SC demonstrated good capacity retention of 83% after 8000 cycles using GV over 0 to 1.2 V (FIG. 4B). The capacitance lost was recovered by adding two external carbon paper current collectors. This finding suggests that the loss originates from the degradation of the gold current collectors, rather than the PEDOT. This finding is consistent with the previous reports that imidazolium-based ionic liquids can slowly corrode gold. (Su et al., *Angew. Chem. Int. ed.* 2009, 121, 5250; Leung et al., *Nanotechnology* 2016, 27, 35204.)

The performance of the vapor-printed SCs disclosed herein was not significantly affected by the mechanical bending to a certain angle (FIG. 4C). Also shown in FIG. 4C, after being flexed 1000 times, the device exhibits only $\approx$7% capacitance loss. The mechanical flexibility of our SC may be attributed to the integration of the PEDOT and gel electrolyte into the intrinsically flexible substrate. The present monolithic scheme could eliminate the possibility of layer delamination. To compare, the multilayers of a stacked sandwich-type SC would incur relative displacement during the consecutive bending cycles, which may cause the delamination of the device. (Wang et al., *Adv. Mater.* 2015, 27, 7451.)

The excellent performance of the vapor-printed supercapacitors can be attributed to the advantages of our novel SC con-figuration. First, a large amount of active materials is effectively incorporated into the 3D structure of the porous substrateowing to the partially conformal nature of the coatings synthe-sized via oCVD. In comparison, with the previous works on printed SC, the penetration of "ink" into the 3D structure of substrate needed to be intentionally hindered.(Choi et al., *Energy Environ. Sci.* 2016, 2812; Hu et aL, *Appl. Phys. Lett.* 2010, 96, 2008.)

In some embodiments, the loading of active materials onto the substrate was limited and the fabrication of devices failed to utilize the intrinsic morphology of the substrate. In certain embodiments, the partial conformality, rather than full conformality, ensured the effective separation of electrodes on both sides, and thus allows the utilization of both sides of the substrate for electrode printing.

In some embodiments, the use of the inactive substrate in this configuration, compared to that in the in-plane configuration, is reduced. In some such embodiments, the hierarchically porous electrode structure generated via oCVD, paired with in situ ion gel electrolyte synthesis, generated excellent electrode-electrolyte interfaces and ensured fast ion-transport kinetics.

In some embodiments, multiple SCs needed to be connected in series and/or in parallel, as batteries are, to form a power source supplying desired voltage and current. One of the most appealing features of vapor-printed integrated SCs disclosed herein is the versatility to vary the device layout by simple manipulation of the mask pattern, which eliminated the use of wire inter-connects. The vapor-printed SCs can be connected in complex series or/and parallel configurations without sacrificing the integrity of the combined device. As illustrated in FIG. 4D, by varying the mask patterns for both sides, series (2S), parallel (2P), and series/parallel (2S2P) connections can be fabricated, to achieve specific voltage and discharging time for the printed device (FIG. 4E). A large-scale vapor-printed SC (12×12 cm$^2$) was fabricated and is shown in FIG. 4F. (Kovacik et al., *Mater. Horiz.* 2015, 221.)

Oxidative Chemical Vapor Deposition

In certain embodiments, oxidative chemical vapor deposition (oCVD) takes place in a reactor. In certain embodiments, precursor molecules, consisting essentially of a chemical metal-containing oxidant and a monomer species, are fed into the reactor. In certain embodiments, a variety of monomer species may be polymerized and deposited by oCVD; these monomer species are well-known in the art. In certain embodiments, this process occurs at a range of pressures from atmospheric pressure to low vacuum. In certain embodiments, the pressure is from about 5 mtorr to about 760 torr. In certain embodiments, the pressure is from about 5 mtorr to about 500 mtorr. In certain embodiments, the pressure is about 5 mtorr, about 10 mtorr, about 15 mtorr, about 30 mtorr, about 50 mtorr, about 75 mtorr, about 100 mtorr, about 125 mtorr, about 150 mtorr, about 175 mtorr, about 200 mtorr, about 225 mtorr, about 250 mtorr, about 275 mtorr, about 300 mtorr, about 325 mtorr, about 350 mtorr, about 375 mtorr, about 400 mtorr, about 425 mtorr, about 450 mtorr, about 475 mtorr, about 500 mtorr, about 600 mtorr, about 700 mtorr, about 800 mtorr, about 900 mtorr, about 1 torr, about 2 torr, about 3 torr, about 4 torr, about 5 torr, about 6 torr, about 7 torr, about 8 torr, about 9 torr, or about 10 ton.

In certain embodiments, chemical metal-containing oxidant species are heavy, but can be sublimed onto a substrate surface using a carrier gas and a heated, porous crucible installed inside the reactor. In certain embodiments, carrier gases and metal-containing oxidants useful in oCVD are well-known in the art. In certain embodiments, evaporation of the oxidant takes place in a resistively heated container inside the reaction chamber. In certain embodiments, evaporation of the oxidant takes place in a resistively heated container inside the reaction chamber underneath the substrate surface to be coated. In certain embodiments, the monomer species is delivered from a source external to the reactor. In certain embodiments, the metal-containing oxidant forms a thin, conformational layer on the substrate surface, which reacts with monomer molecules as they adsorb. Oxidants in the vapor form can also be delivered for this polymerization process, for example, bromine ($Br_2$) and transition-metal-containing liquid oxidants (e.g., $VOCl_3$, $VOCl_4$).

In certain embodiments, acid-catalyzed side reactions may be reduced or eliminated using one or more the following techniques: introducing a base, including but not limited to pyridine, to react with any acid that is formed in situ; heating the substrate to temperatures above about 60° C., about 70° C., about 80° C. or about 90° C., for example, to accelerate evaporation of the acid as it is formed; and biasing the substrate with a positive charge using a DC power supply to favor the oxidation of monomeric and oligomeric species adsorbed on the substrate.

EXEMPLIFICATION

Monolithic Flexible Supercapacitors Integrated into Single Sheets of Paper and Membrane via Vapor Printing This example presents a novel solid-state design in which all the components of a sandwich-like SC are monolithically integrated into a single substrate, eliminating the possibility of multilayer delamination. The integrated architecture relies on polymeric electrodes deposited into both sides of a single sheet of flexible porous substrate. The electrodes penetrate partially, but not fully, into the flexible substrate. Thus, the interior of the substrate can function as a separator and a solid-state electrolyte reservoir. Both electrodes consist of pseudocapacitive conducting polymer grown by oxidative chemical vapor deposition (oCVD).

Methods

Deposition of oCVD PEDOT electrode: The oCVD process procedure and the reactor configuration are described in detail elsewhere. Im et al. *Macromolecules* 2007, 40, 6552. Briefly, 3,4-ethylenedioxythiophene monomer (Sigma-Aldrich, 97%) was evaporated at 140° C. and metered at ~2 sccm. $FeCl_3$ oxidant (Sigma-Aldrich, 97%) was controllably evaporated from a resistively heated crucible at ~230° C. The total pressure was maintained ~1 mTorr. Both sides of the substrate were covered by shadow masks in intimate contact for in situ patterning. The shadow masks were cut from paper stock (Staples) by a square punch (1.25×1.25 cm$^2$) and a razor blade. The substrate with shadow masks was maintained at upright position in the reactor so that both sides of the substrate were exposed to the oCVD precursors. The reaction was allowed for ~90 minutes and repeated six times. Last, samples were thoroughly rinsed with methanol (Sigma-Aldrich, 99.8%).

Device fabrication: Cellulose filter paper and commercially available nylon membrane (pore size ~5 μm) were treated by O$_2$ plasma (Harrick Scientific, 29.6W) for 3 minutes to create surface hydroxyl groups. Immediately after plasma treatment, the substrates were placed into a clean beaker containing (3-mercapto-propyl)-trimethoxysilane (Sigma-Aldrich, 95%)/isopropanol (Sigma-Aldrich, 99.5%) (=1/50, v/v) solution. The silanization was allowed overnight to graft thiol groups for enhanced adhesion between the substrate and the gold layer. The substrates were then washed by anhydrous isopropanol and dried under vacuum for 5 hours. The silanized substrates were shadow masked and coated with gold by sputtering (Polaron SC7640, plasma current ~20 mA) for 960 s each side. PEDOT electrodes were deposited via oCVD on both sides of the masked substrates as described above. N,N-dimethylacrylamide (DMAA, Sigma-Aldrich, 99%), ethylene glycol dimethylacrylate (EGDMA, 2 vol % based on DMAA, Sigma-Aldrich, 98%), 4,4'-azobis(4-cyanovaleric acid) (ABCVA, 1 wt % based on the monomers, Sigma-Aldrich, 98%) were mixed with ionic liquid 1-ethyl-3-methylimidazolium tetrafluoroborate ([EMIM][BF$_4$], 300 vol % based on the monomers, Sigma-Aldrich, 99.0%) under vigorous stirring until the ABCVA powder appeared fully dissolved. The precursor solution was drop-cast on the substrate with PEDOT electrodes, and infiltrated the electrodes spontaneously. Excessive solution was absorbed by wipers. The wetted samples were heated by a heat gun (Master Appliance Varitemp) until the samples appeared dry, and immediately placed in an oven at 90° C. overnight to form solid-state devices. For comparison, a NM-based SC was made with H$_2$SO$_4$-PVA electrolyte prepared according to a previously reported method. Briefly, 2 g H$_2$SO$_4$ was mixed with 20 mL deionized water and heated up to 85° C. under vigorously stirring. Subsequently 2 g PVA (polyvinyl alcohol, molecular weight 89,000-98,000, Sigma-Aldrich) powder was added to the solution. The solution was stirred until it appeared clear. The NM with printed PEDOT electrodes was immediately dip-coated in the hot solution. The electrode coated by the solution was left in a fume hood overnight to allow to dry.

Electrode, electrolyte and substrate characterization: The cross-sections of the substrates with PEDOT coatings were obtained using Cryo-Snap method described in detail elsewhere. Briefly, a sample was cut into a thin strip and subsequently submerged in water in a glass tube. The tube containing water and sample was slowly submerged into liquid nitrogen, and removed after being frozen for 2 minutes. The glass tube was immediately scored at the location of interest and snapped into two. The fractured samples were dried under vacuum overnight. For cross-section imaging and EDS, the fractured surfaces were coated by carbon (Denton Desk II, ~35A) to increase conductivity. The SEM images and EDS elemental map were obtained using JOEL JSM-6010LA. High-resolution FE-SEM images were obtained using JOEL JSM-6700F. The XPS spectra were acquired on a SSX-100X-probe (Surface Science Instruments) spectrometer with a monochromatized Al Kα source operated at 1486.6 eV. The pass energy was 150 V for survey scans. The pressure during analysis was kept under $1.6 \times 10^{-9}$ Torr. The sample charge was neutralized by a 1 eV electron beam flood gun. CasaXPS software was used to analyze the spectra. ATR-FTIR measurement was performed on a Nicolet iS50 FT-IR Spectrometer (Thermo Scientific) equipped with a MCT/A detector cooled by liquid nitrogen. Nitrogen adsorption/desorption was conducted on an automatic volumetric adsorption analyzer (Micromeritics ASAP2020).

Device characterization: CV and GV measurements of the samples were conducted in a two electrode system using an electrochemistry workstation (CHI660D, CH Instrument). Toothless alligator clips (Mueller, nickel-plated steel) were used to connect the workstation to the protruding part of the gold current collector (indicated by +/− in FIG. 4D). A small piece of carbon paper was inserted in between the alligator jaw and the gold protrude to enhance the electrical contact. EIS measurements were performed on a potentiostat (VMP3, Bio-Logic). EC-Lab and ZView software were used for the circuit fitting. A small piece of platinum foil was inserted in between the alligator jaw and the gold protrude to enhance the electrical contact. Compressive flexing test for the devices was performed using an ADMET micro EP miniature testing machine. The GV curves were used to calculate the specific volumetric capacitances, energy density, and power density as follows:

Specific volumetric capacitance of the SC C$_V$ (F cm$^{-3}$) was calculated using the equation:

$$C_V = \frac{I_D \cdot \Delta t}{V_{sc} \cdot \Delta V}$$

where I$_D$ (A) is the discharge current, Δt (s) is the discharging time, V$_{SC}$(cm$^3$) is the volume of the entire SC device, and ΔV (V) is the cell voltage.

Specific gravimetric capacitance of the electrode c$_{electrode}$ (F g$^{-1}$) was calculated according to the formula:

$$C_{electrode} = \frac{4I_D \cdot \Delta t}{m \cdot \Delta V}$$

where m (g) is the total mass of both electrodes determined by measuring the mass change of the substrate before and after PEDOT deposition.

The volumetric energy density of the SC E$_V$ (Wh cm$^{-3}$) was obtained from the equation:

$$E_V = \frac{C_V \cdot \Delta U^2}{2 \times 3600}$$

where ΔU (V) is the operating potential window, equal to ΔV subtracting the IR drop (V). The power density P$_V$ (W cm$^{-3}$) was calculated from the formula:

$$P_V = \frac{3600 E_V}{\Delta t}$$

SUMMARY

A novel monolithically integrated SC design enabled by oCVD was developed herein. Pseudocapacitive PEDOT was synthesized into both sides of single sheets of porous substrate, with the inner part of the substrate functioning as separator. While the oCVD PEDOT gave a conformal coverage allowing for utilization of large surface area of the porous substrate and large loading of active materials, its finite vapor penetration depth ensured separation of the electrodes and thus prevents shorting. The applicability of this method to filter paper was demonstrated, thereby representing the inexpensive substrates, and porous nylon membrane, and thus performance optimized morphology. In situ ion gel synthesis was used for the solid-state electrolyte incorporation. The monolithic device was shown to have excellent specific volumetric capacitance, power density, and energy density, due to the large loading of active materials, minimization of inactive materials, and good electrode-electrolyte interfaces formed. SCs in various circuit configurations could be easily printed on a single substrate.

INCORPORATION BY REFERENCE

All US patents and US and PCT published patent applications mentioned in the description above are incorporated by reference herein in their entirety.

EQUIVALENTS

Having now fully described the present invention in some detail by way of illustration and example for purposes of clarity of understanding, it will be obvious to one of ordinary skill in the art that the same can be performed by modifying or changing the invention within a wide and equivalent range of conditions, formulations and other parameters without affecting the scope of the invention or any specific embodiment thereof, and that such modifications or changes are intended to be encompassed within the scope of the appended claims.

We claim:

1. A method for preparing a monolithic flexible supercapacitor comprising:
    (i) a porous substrate;
    (ii) a gold current collector;
    (iii) a pseudo-capacitive material; and
    (iv) an ion gel electrolyte;
    wherein the method comprises the steps of:
    (i) applying a gold current collector to a porous substrate;
    (ii) depositing an electrode of a pseudo-capacitive material onto of the gold current collector; and
    (iii) drop-casting onto the electrode a homogenous mixture comprising an ionic liquid.
2. The method of claim 1, wherein the porous substrate is a single porous substrate.
3. The method of claim 1, wherein the porous substrate comprises cellulose filter paper or a porous nylon membrane.
4. The method of claim 1, further comprising covering each side of the porous substrate with a shadow mask.
5. The method of claim 4, wherein the shadow masks comprise paper.
6. The method of claim 4, further comprising exposing the substrate to an oCVD precursor mixture, wherein said precursor mixture comprises a monomer selected from the group consisting of EDOT, pyrrole, thiophene, 3-thiopheneacetic acid, and 3-thiopheneethanol; and an oxidant selected from the group consisting of iron(III) chloride, copper(II) chloride, bromine, and vanadium oxytrichloride.
7. The method of claim 6, wherein the monomer is EDOT; and the oxidant is $FeCl_3$.
8. The method of claim 1, further comprising rinsing the porous substrate with an alcohol solvent.
9. The method of claim 1, further comprising treating the porous substrate with $O_2$ plasma.
10. The method of claim 9, further comprising treating the substrate with (3-mercapto-propyl)-trimethoxusilane/isopropanol solution after the substrate is treated with $O_2$ plasma.
11. The method of claim 1, wherein step (ii) comprises vapor printing.
12. The method of claim 11, wherein the vapor printing is oxidative chemical vapor deposition (oCVD).
13. The method of claim 1, wherein the pseudo-capacitive material is poly(3,4-ethylenedioxthiophene) (PEDOT).
14. The method of claim 1, wherein the homogenous mixture further comprises a monomer, a crosslinker, and a thermal initiator.
15. The method of claim 14, wherein:
    the ionic liquid is 1-ethyl-3-methylimidazolium tetrafluoroborate ($[EMIM][BF_4]$);
    the monomer is N, N-dimethylacrylamide (DMAA);
    the crosslinker is ethylene glycol dimethacrylate (EGDMA); and
    the thermal initiator is 4,4'-azobis(4-cyanovaleric acid) (ABCVA).

* * * * *